United States Patent [19]

Hiratsuka et al.

[11] Patent Number: 4,976,815

[45] Date of Patent: Dec. 11, 1990

[54] DRAFT CHAMBER

[75] Inventors: Yutaka Hiratsuka, Chiyoda; Tadahiro Ohmi, Sendai-Shi, Miyagi; Junichi Murota, Sendai; Yoshio Fujisaki, Chiyoda; Masato Noda, Chiyoda; Yoshimitsu Kitada, Chiyoda; Terutaka Sahara, Chiyoda, all of Japan

[73] Assignees: Ohmi Tadahiro; Hitachi Plant Engineering & Construction Co., Ltd., both of Japan

[21] Appl. No.: 426,208

[22] Filed: Oct. 25, 1989

Related U.S. Application Data

[63] Continuation of Ser. No. 172,783, Mar. 28, 1988, abandoned.

[30] Foreign Application Priority Data

Apr. 3, 1987 [JP] Japan .................. 62-082378

[51] Int. Cl.⁵ .................. H01L 21/306; B01L 1/00
[52] U.S. Cl. .................. 156/345; 98/115.3
[58] Field of Search .................. 156/345; 98/115.3, 36, 98/115.2

[56] References Cited

U.S. PATENT DOCUMENTS

| | | | |
|---|---|---|---|
| 3,182,466 | 5/1965 | Beckwith | 98/36 |
| 3,396,651 | 8/1968 | Kamiya | 98/36 |
| 3,604,333 | 9/1971 | Nelson | 98/115.3 |
| 3,686,836 | 8/1972 | Rabilloud et al. | 98/115.3 X |
| 3,728,866 | 4/1973 | Layton | 98/115.3 X |
| 3,747,505 | 7/1973 | Turko | 98/115.3 |
| 3,752,056 | 8/1973 | Chamberlin et al. | 98/115.3 |
| 3,994,210 | 11/1976 | Davis | 98/36 |
| 4,422,369 | 12/1983 | Smets | 98/36 |
| 4,466,454 | 8/1984 | Layton | 98/115.3 X |
| 4,637,301 | 1/1987 | Shields | 98/115.3 |
| 4,742,764 | 5/1988 | Duvlis | 98/36 |

Primary Examiner—Kenneth M. Schor
Attorney, Agent, or Firm—Oliff & Berridge

[57] ABSTRACT

A draft chamber is located within a clean room for sequentially immersing and processing carriers such as silicone wafers in a plurality of solution vessels provided in the draft chamber. In the draft chamber, a first air flow moves in a substantially horizontal direction from the front portion of the draft chamber toward the rear portion above the surfaces of solutions contained in chemical solution vessels which generate toxic gasses and a second air flow moves downward from the ceiling of the draft chamber. Thus, the toxic gasses generated from the chemical solution vessels are prevented from leaking into the clean room.

7 Claims, 5 Drawing Sheets

DRAFT CHAMBER

This is a continuation of application Ser. No. 07/172,783 filed Mar. 28, 1988 now abandoned.

BACKGROUND OF THE INVENTION

1. Field of the Invention

The present invention relates to a draft chamber and in particular, to a draft chamber in which a chemical liquid vessel is provided that is used to chemically clean and etch a silicone wafer or the like in a process for manufacturing a semiconductor.

2. Description of the Related Art

A semiconductor manufacturing process includes a step of chemically cleaning and etching a silicone wafer. For example, in the chemical cleaning step, the silicone wafer is immersed and treated for a period of time of 10 to 20 minutes in a vessel containing a chemical solution composed of hydrogen peroxide, ammonia, hydrochloric acid, sulfuric acid and the like heated up to high temperatures (80° C. - 120° C.). Also, in the etching step, the silicone wafer is immersed in a vessel containing a chemical solution composed of fluoric acid, nitric acid and the like for a period of time of several minutes.

Now, the above-mentioned processes for treatment of the silicone wafer are carried out within a draft chamber which is provided in a clean room, in order to prevent the wafer from being attached by dust or the like.

In a conventional draft chamber of this type, in order to prevent toxic gasses, which are generated from the chemical solution vessel, from leaking into the clean room, there is provided a duct for exhaustion so that the toxic gasses can be exhausted externally through the exhaust duct by means of driving of a fan.

According to the conventional draft chamber, however, due to the fact that the exhaustion is executed in such a manner that the toxic gasses are dispersed and mixed with the air in the draft chamber, the air existing within the clean room for air conditioning is also exhausted in a large amount together with the toxic gasses by a fan of a large capacity. As a result of this, a large amount of air is wasted and also, due to the fan driving, much power is required.

SUMMARY OF THE INVENTION

The present invention aims at eliminating the drawbacks found in the above-mentioned prior art draft chamber.

Accordingly, it is an object of the invention to provide a draft chamber in which toxic gasses generated from a chemical solution vessel can be exhausted highly efficiently with a small amount of exhaust air without leaking the toxic gasses into a clean room.

In order to achieve the above object, according to the present invention, there is provided a draft chamber arranged within a clean room containing therein a plurality of liquid solution vessels and formed in the front surface thereof with a window for operating carriers, and used to carry out a process for sequentially immersing the carriers into the liquid solution vessels, the draft chamber comprising: a first air flow generating means for generating a first air flow flowing substantially in a horizontal direction from the front portion of the draft chamber toward the rear portion thereof above the surface of the solution at least in one or more chemical solution vessels, from which toxic gasses are generated, among the above-mentioned plurality of solution vessels; and, a second air flow generating means for generating a second air flow flowing from the ceiling of the draft chamber toward the bottom thereof, whereby the toxic gasses generated from the chemical solution vessel can be prevented from leaking into the clean room.

According to the invention, the first air flow flowing substantially in the horizontal direction that is generated from the first air flow generation means is used to discharge directly the toxic gasses generated from the chemical solution vessel in such a manner that the toxic gasses are not dispersed into the draft chamber as much as possible, and a small amount of toxic gasses dispersing beyond the air seal formed by the first air flow are restricted by the second air flow (down flow) flowing from the ceiling of the draft chamber toward the bottom thereof, so that the leaking of the toxic gasses into the clean room by means of the carrier operation window can be prevented.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DETAILED DESCRIPTION OF THE INVENTION

Detailed description will hereunder be given of the preferred embodiment of a draft chamber according to the present invention with reference to the accompanying drawings.

Figure 1:
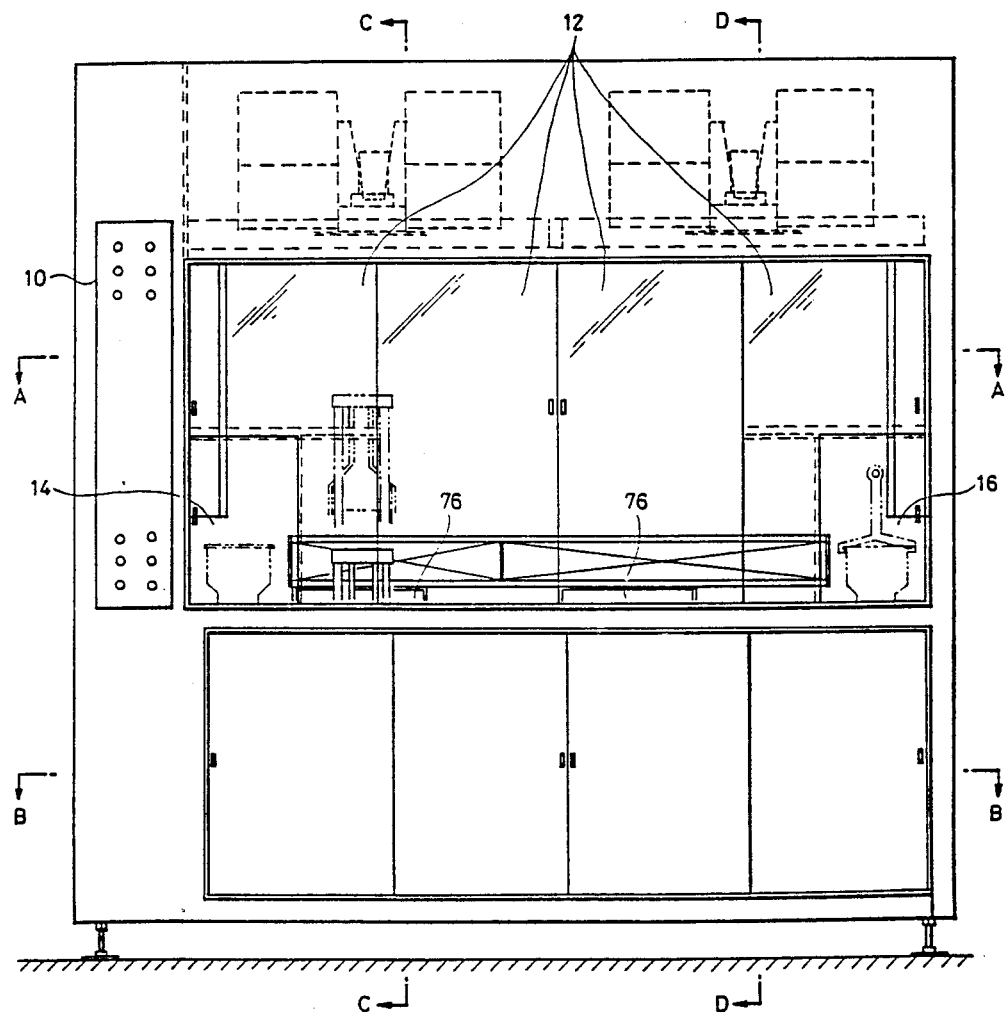
FIG. 1 is a front view of an embodiment of a draft chamber according to the invention.

In the drawings, there is shown a draft chamber according to the invention. The draft chamber is provided within a clean room and the draft chamber has a front surface which is provided with an operation panel 10 and a window for operation of wafer carriers, as shown in FIG. 1. The operation window is provided with 4 transparent sliding doors 12 and the left-most and right-most transparent sliding doors are provided with a small sliding door 14 for supply of carriers and a small sliding door 16 for taking out of carriers, respectively.

Figure 2:
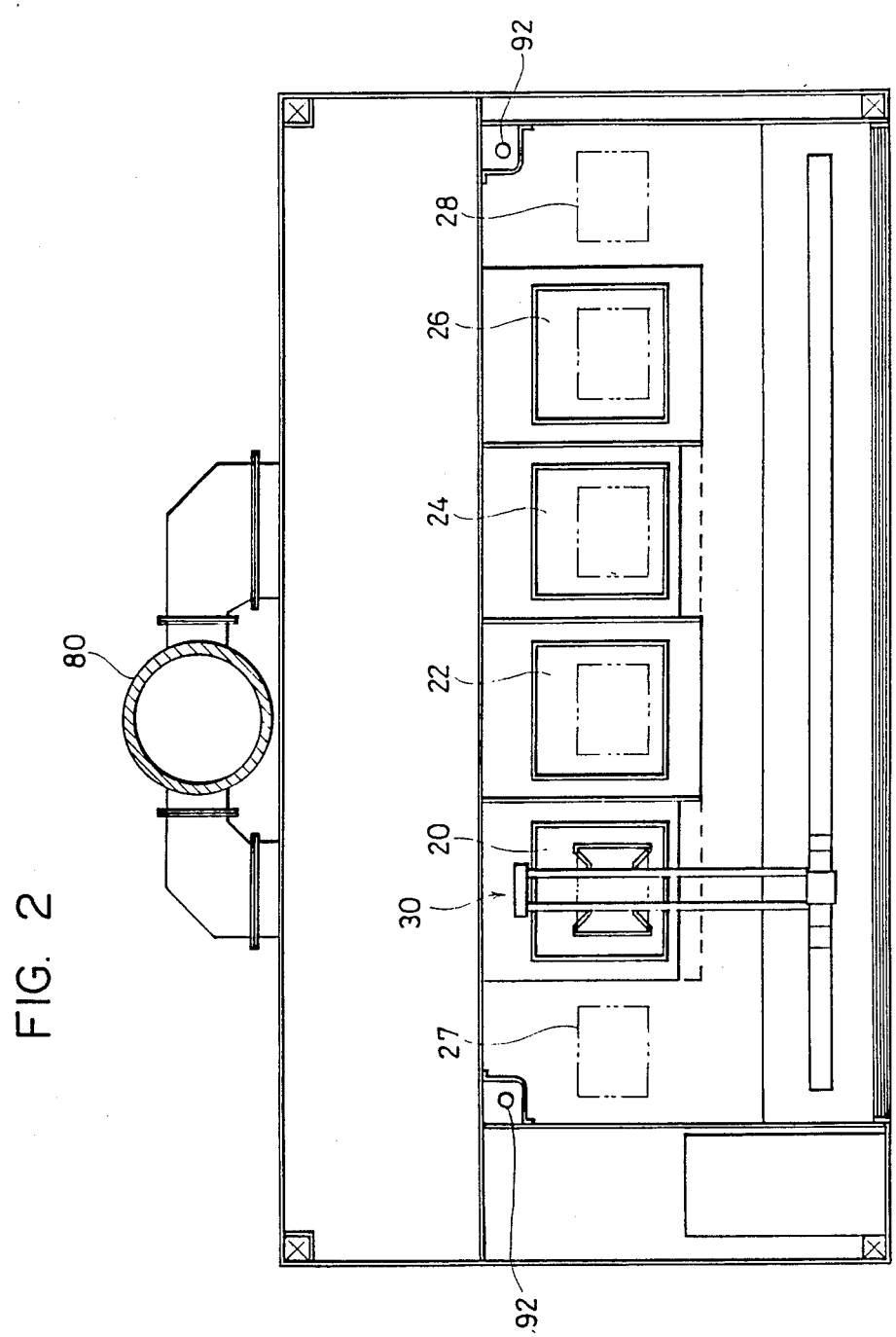
FIG. 2 is a section view taken along the line A—A in FIG. 1.

Also, within the draft chamber, as shown in FIG. 2, there are arranged 4 vessels in the order of an $NH_4OH + H_2O_2$ chemical solution vessel 20, a rinse vessel 22, HF chemical solution vessel 24 and a rinse vessel 26.

Figure 4:
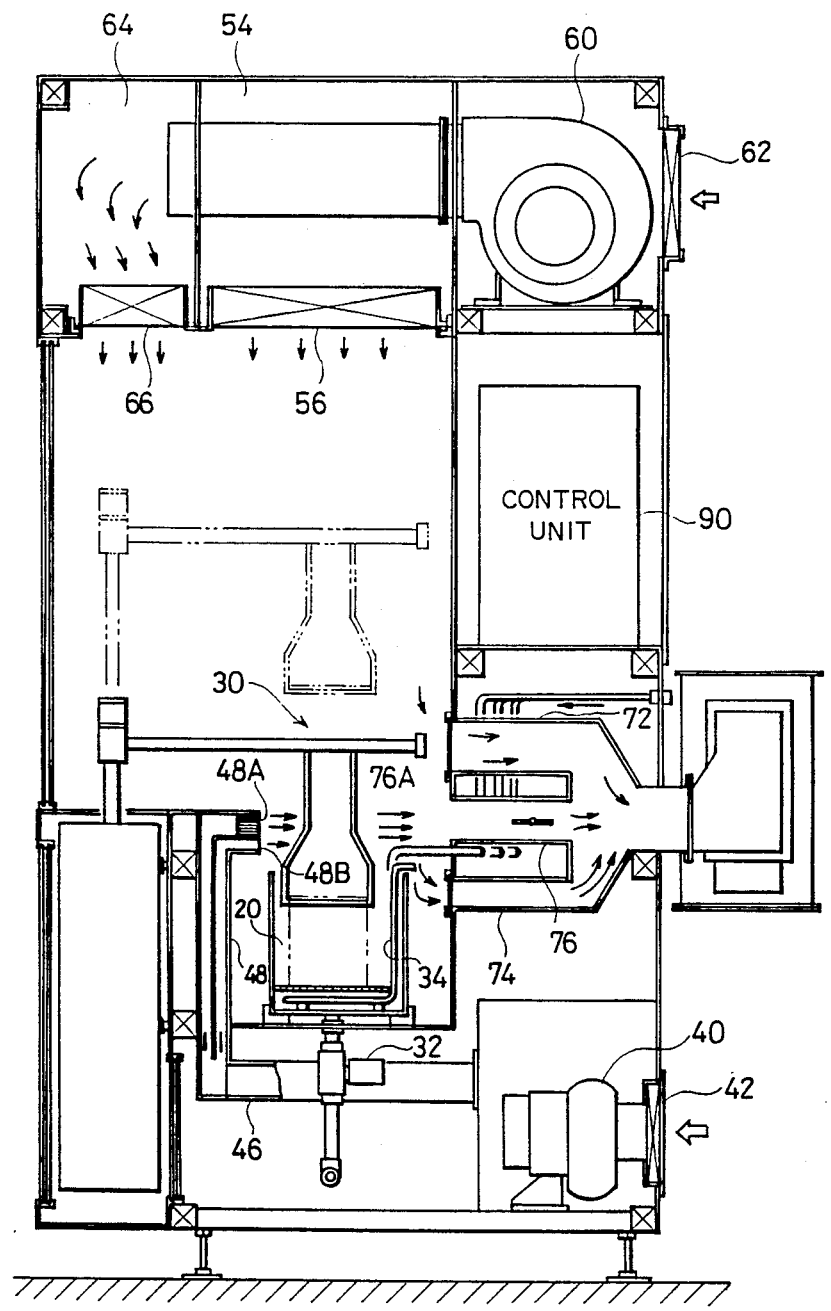
FIG. 4 is a section view taken along the line C—C in FIG. 1.

In the chemical solution vessel 20, there is provided a heater 34 and the two chemical solution vessels 20, 24 are supplied with chemical solutions by a chemical solution supply equipment (not shown), while the two rinse vessels 22, 26 are supplied with ultra-pure water. Also, waste solutions in the respective solution vessels are wasted from the bottoms of the solution vessels through an automatic discharge valve 32 (see FIGS. 4 and 5). Further, within the draft chamber there is provided a carrier conveying device 30 for conveying wafer carriers from a carrier supply section 27 through the above-mentioned respective solution vessels to a wafer take-out section 28. As shown in FIG. 4, the carrier conveying device 30 is arranged such that it can be moved in a vertical direction in order to be able to immerse the wafer carriers in the respective solution vessels.

Now, in the floor surface of the draft chamber there is provided a seal air fan 40, and in the ceiling of the draft chamber there are arranged a first air supply fan 50 (FIG. 5) and a second air supply fan 60 (FIG. 4).

Figure 3:
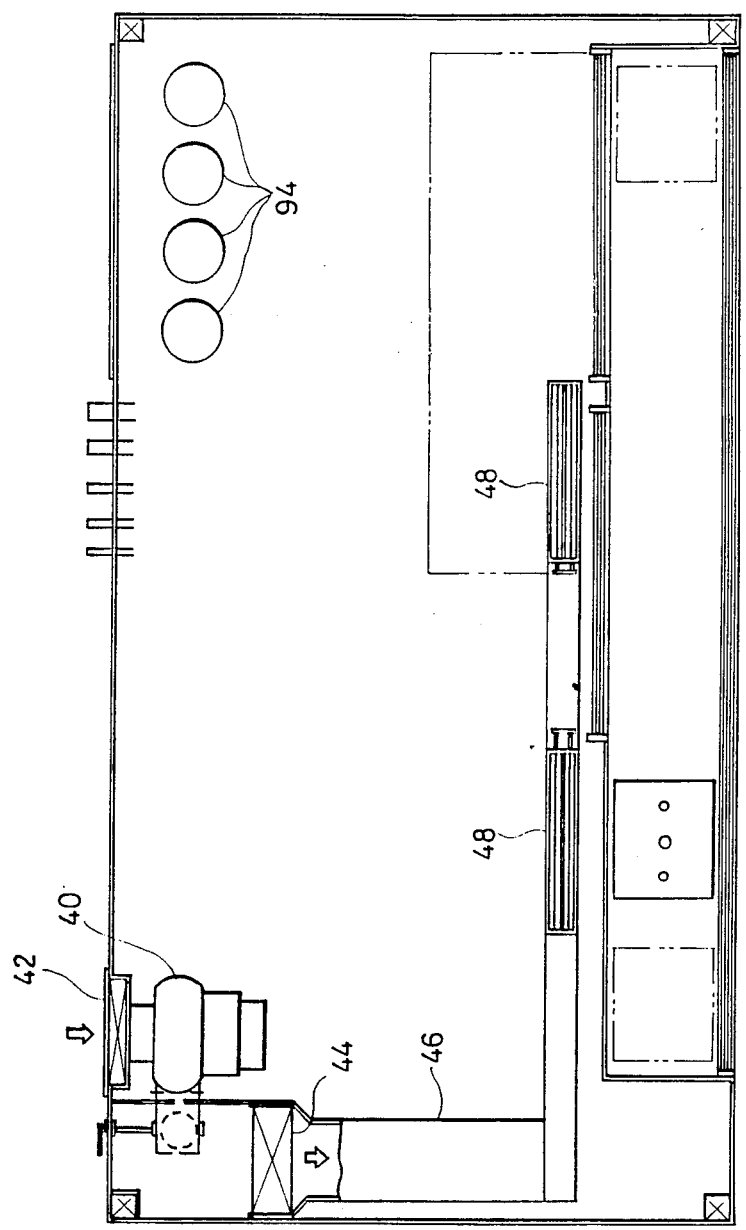
FIG. 3 is a section view taken along the line B—B in FIG. 1.

The seal air fan 40, as shown in FIGS. 3 and 4, inhales the clean air in the clean room by means of an inhale port 42 with pre-filter, and feeds out seal air through a HEPA filter 44, ducts 46 and 48 from blow-off ports 48A and 48B. It should be noted here that the duct 48, as shown in FIG. 3, is located to correspond only to the chemical solution vessels 20, 24, so that the seal air is fed out only above the chemical solution vessels 20, 24. Also, the above-mentioned seal air is fed out from the blow-off ports 48A and 48B in the form of upper and lower, two-layer flows in such a manner that the rate of the upper flow is higher (on the order of 1 m/s) while the rate of the lower flow is on the order of 0.2 m/s. This aims at reducing the amount of evaporation of the chemical solutions and also preventing the air flow from colliding against and turbulently flowing into pipes provided along the edges of the vessels to thereby eliminate the possibility that mists may be scattered around.

Figure 5:
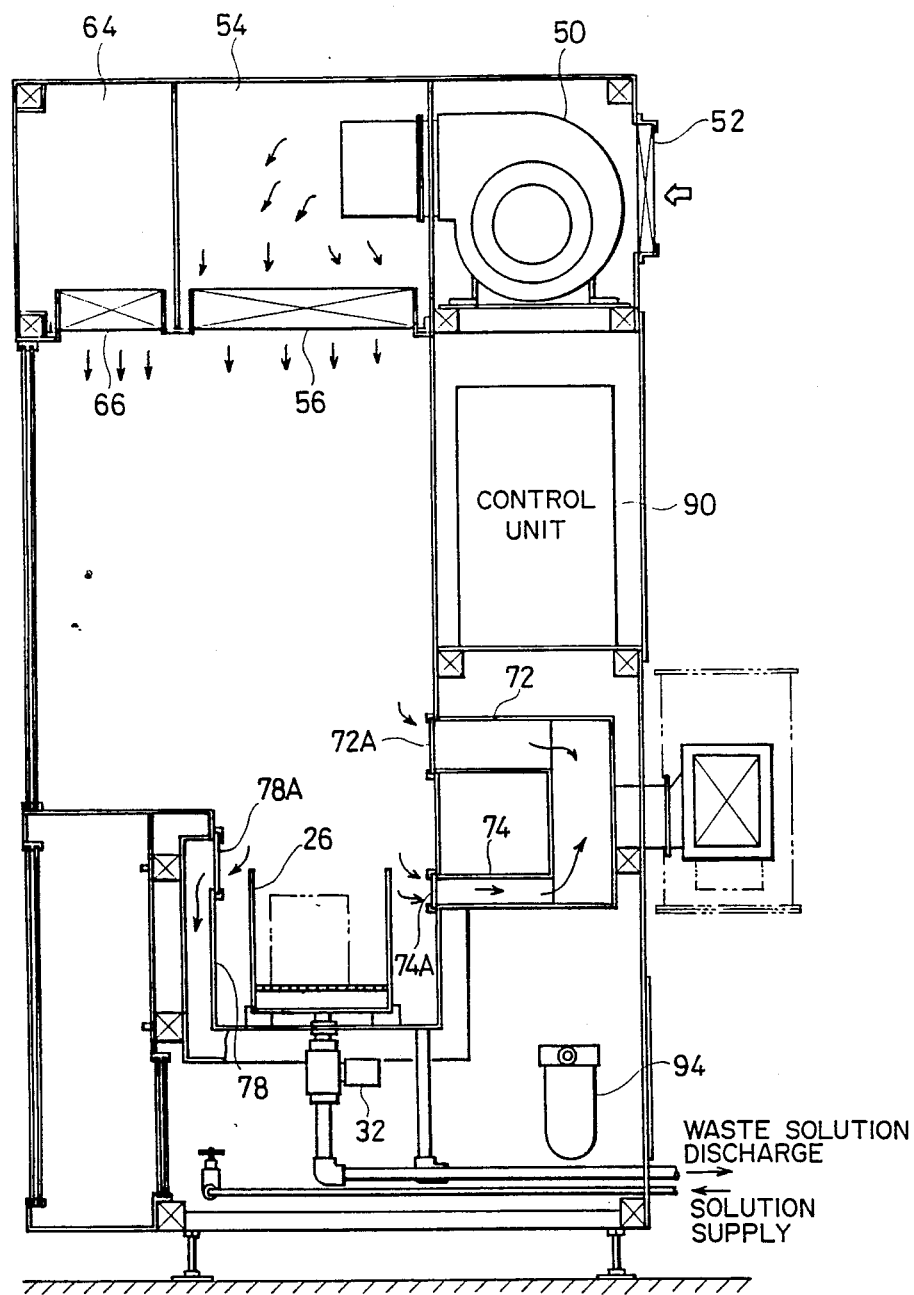
FIG. 5 is a section view taken along the line D—D in FIG. 1.

On the other hand, the first air supply fan 50, as shown in FIG. 5, inhales the clean air in the clean room through an air inhale port with pre-filter 52, and blows out the air flow (down flow) advancing from the ceiling of the draft chamber toward the bottom thereof by means of a duct 54 and an HEPA filter 56 respectively provided in the ceiling of the draft chamber.

Also, the second air supply fan 60, as shown in FIG. 4, takes in the clean air in the clean room through another air inhale port with pre-filter 62, and blows out another down flow through a duct 64 and an HEPA filter 66 in the ceiling. Here, the rate of the down flow blown off from the HEPA filter 56 is set as 0.3 m/s, so that the flow of the above-mentioned seal air may not be disturbed. Also, the rate of the down flow blown off from the HEPA filter 66 is set up to 0.5 m/s, that is, the rate of the latter flow is set slightly higher than that of the former down flow, thereby preventing the toxic gasses from escaping from the carrier operation window into the clean room.

On the other hand, on the back surface of the draft chamber, as shown in FIGS. 4 and 5, there are arranged ducts 72, 74 for air exhaustion, and further in the portion of the draft chamber where the chemical solution vessels 20, 24 are located, there is arranged a duct 76 with an air inhale port 76A in a position substantially opposed to the above-mentioned blow-off ports 48A, 48B (see FIGS. 1 and 4). In addition, in the rinse vessels 22, 26, as shown in FIG. 5, there is provided a duct 78 which communicates with the duct 74. The ducts 72, 74 and 78 have air inhale ports which are provided with dampers 72A, 74A and 78A, respectively.

These ducts join together sequentially and, as shown in FIG. 2, are connected to an air exhaust pipe 80. The exhaust pipe 80 is provided with an air exhaust fan (not shown). Reference numeral 90 designates a control unit, 92 stands for a fluorescent lamp, and 94 represents a filter for solution.

According to the draft chamber of the invention constructed in the above-mentioned manner, the toxic gasses generated from the chemical solution vessels 20, 24 can be generally sealed by the seal air flowing in the substantially horizontal direction from the blow-off ports 48A, 48B toward the air inhale port 76A of the guide duct 76, and the toxic gasses flowing out of the air seal can be prevented against dispersion by the 2-layer down flows respectively blown out from the HEPA filters 56 and 66.

Although in the illustrated embodiment the two-layer down flows are generated by the two different air supply fans, respectively, this is not limitative, but the two-layer down flows may be generated by dividing the air flow, that is generated from a single air supply fan, into two air flows in such a manner that the respective air flows have their own amounts (velocity) of air required. Also, in equipment wherein chemical process operations such as a carriers conveying operation and the like are completely performed automatically, since a front face operation door will not be opened, the air flows from the ceiling of the draft chamber may be made into one flow. In this case, therefore, a single air supply fan and a single HEPA filter may be used.

As has been described hereinbefore, according to the draft chamber of the invention, due to the fact that the toxic gasses generated from the chemical solution vessels can be efficiently prevented against dispersion by use of the seal air flowing in the substantially horizontal direction as well as the down flows blown out from the ceiling of the draft chamber, the amount of air flow required can be reduced to about one third when compared with the prior art draft chambers to thereby decrease the power required to drive fans, and also there is eliminated the need to discharge in large quantities the conditioned clean air within a clean room.

It should be understood, however, that here is no intention to limit the invention to the specific forms disclosed, but on the contrary, the invention is to cover all modifications, alternate constructions and equivalents falling within the spirit and scope of the invention as expressed in the appended claims.

What is claimed is:

1. A draft chamber provided within a clean room, containing therein a plurality of chemical solution vessels generating toxic gasses and including a window having means for operating carriers in the front surface of the draft chamber to process said carriers by sequentially immersing said carriers in said solution vessels, said draft chamber comprising:

first air flow generating means including a seal air fan for inhaling clean air in the clean room, a blow-off port formed in front of an upper edge of said solution vessels generating toxic gasses, for blowing said clean air, an inhalant port, formed opposite to said blow-off port in the rear of said solution vessels, for inhaling air, and a duct having an exhaust fan for discharging the inhaled air externally of said clean room, for generating a first air flow moving in a substantially horizontal direction from said blow-off port toward said inhalant port above the surfaces of solutions contained in said solution vessels to air seal the upper surfaces of said solution vessels; and second air flow generating means for generating a second air flow moving downward from the ceiling of said draft chamber to be discharged out externally of said clean room, said second air flow being slower than said first air flow;

the first and second air flow generating means being provided and positioned so that said toxic gasses generated from said chemical solution vessels are prevented from leaking into said clean room and are discharged through said inhalant port.

2. A draft chamber as set forth in claim 1, wherein said first air flow generating means is structured to generate upper and lower air flows in two layers so that the velocity of said lower air flow is slower than that of said upper air flow.

3. A draft chamber as set forth in claim 2, wherein said first air flow generating means is structured to provide the velocity of said upper air flow on the order of 1 m/s and the velocity of said lower air flow on the order of 0.2 m/s.

4. A draft chamber as set forth in claim 1, wherein aid second air flow generating means is structured to generate an outer air flow moving along said operation window and an inner air flow moving toward said solution vessels so that the velocity of said inner air flow is slower than that of said outer air flow.

5. A draft chamber as set forth in claim 4, wherein said second air flow generating means is structured to provide the velocity of said inner air flow on the order of 0.3 m/s and the velocity of said outer air flow on the order of 0.5 m/s.

6. A draft chamber, provided within a clean room, containing therein a plurality of chemical solution vessels generating toxic gasses and including a window having means for operating carriers in the front surface of the draft chamber to process said carriers by sequentially immersing said carriers in said solution vessels, said draft chamber comprising:

first air flow generating means for generating a first air flow moving in a substantially horizontal direction from the front portion of said draft chamber toward the rear portion thereof above the surface of said vessels generating toxic gasses, said first air flow generating means being structured to provide upper and lower air flows in two layers so that the velocity of said lower air flow is slower than that of said upper air flow; and second air flow generating means for generating a second air flow moving downward from the ceiling of said draft chamber;

the first and second air flow generating means being provided and positioned such that said toxic gasses generated from said solution vessels are prevented from leaking into said clean room.

7. A draft chamber according to claim 6, wherein the first air flow generating means generates said first air flow such that there can be provided a velocity of said upper air flow on the order of 1 m/s and a velocity of said lower air flow on the order of 0.2 m/s.

* * * * *